United States Patent
Kwon et al.

(10) Patent No.: US 9,921,414 B2
(45) Date of Patent: *Mar. 20, 2018

(54) DISPLAY DEVICE

(71) Applicant: SAMSUNG DISPLAY CO., LTD., Yongin-si, Gyeonggi-do (KR)

(72) Inventors: Jaejoong Kwon, Suwon-si (KR); Hyesog Lee, Osan-si (KR); Chio Cho, Gwangju (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/009,669

(22) Filed: Jan. 28, 2016

(65) Prior Publication Data

US 2016/0372701 A1    Dec. 22, 2016

(30) Foreign Application Priority Data

Jun. 22, 2015    (KR) .................. 10-2015-0088412

(51) Int. Cl.
| | |
|---|---|
| *H01L 21/00* | (2006.01) |
| *G02B 27/28* | (2006.01) |
| *G02B 1/14* | (2015.01) |
| *G02B 5/00* | (2006.01) |
| *H01L 51/52* | (2006.01) |

(52) U.S. Cl.
CPC ............ *G02B 27/286* (2013.01); *G02B 1/14* (2015.01); *G02B 5/003* (2013.01); *H01L 51/524* (2013.01); *H01L 51/5268* (2013.01)

(58) Field of Classification Search
CPC   H01L 51/5246; H01L 27/323; H01L 51/5284
See application file for complete search history.

(56) References Cited

U.S. PATENT DOCUMENTS

| | | | |
|---|---|---|---|
| 8,093,804 B2 | 1/2012 | Lee et al. | |
| D769,291 S * | 10/2016 | Kim | ............................ D14/486 |
| 2008/0256482 A1* | 10/2008 | Lee | ......................... G06F 21/10 |
| | | | 715/781 |
| 2012/0089917 A1* | 4/2012 | Kwahk | ................. G06F 3/0486 |
| | | | 715/735 |
| 2014/0098040 A1* | 4/2014 | Kwon | ....................... G06F 3/01 |
| | | | 345/173 |

(Continued)

FOREIGN PATENT DOCUMENTS

| | | |
|---|---|---|
| KR | 10-2010-0086533 A | 8/2010 |
| KR | 10-2011-0056897 A | 5/2011 |

(Continued)

*Primary Examiner* — Laura Menz
(74) *Attorney, Agent, or Firm* — Lewis Roca Rothgerber Christie LLP

(57) ABSTRACT

A display device according to one or more embodiments includes a display panel configured to display an image, a window substrate above the display panel, and including a display area configured to transmit the image therethrough, and a non-display area around the display area, a first adhesive layer between the display panel and the window substrate, and a decoration film above an upper surface of the window substrate. The decoration film includes a base film and a printing layer at a first surface of the base film.

20 Claims, 11 Drawing Sheets

(56) References Cited

U.S. PATENT DOCUMENTS

| | | | |
|---|---|---|---|
| 2014/0146004 A1* | 5/2014 | Jang | G06F 1/1698 |
| | | | 345/174 |
| 2014/0153100 A1* | 6/2014 | Yi | G02B 5/223 |
| | | | 359/609 |
| 2014/0184951 A1* | 7/2014 | Yeh | G06F 3/044 |
| | | | 349/12 |
| 2015/0346868 A1* | 12/2015 | Kwon | G06F 3/044 |
| | | | 345/174 |
| 2016/0234362 A1* | 8/2016 | Moon | H04M 1/0202 |
| 2016/0365402 A1* | 12/2016 | Lee | G02B 27/26 |
| 2016/0372701 A1* | 12/2016 | Kwon | G02B 1/14 |
| 2016/0377770 A1* | 12/2016 | Kwon | G02B 5/003 |
| | | | 359/599 |
| 2017/0020014 A1* | 1/2017 | Lee | G06F 3/044 |

FOREIGN PATENT DOCUMENTS

| | | |
|---|---|---|
| KR | 10-2014-0071093 A | 6/2014 |
| KR | 10-2014-0136336 A | 11/2014 |

\* cited by examiner

DISPLAY DEVICE

CROSS-REFERENCE TO RELATED APPLICATION

This application claims priority to, and the benefit of, Korean Patent Application No. 10-2015-0088412, filed on Jun. 22, 2015, in the Korean Intellectual Property Office ("KIPO"), the entire content of which is incorporated herein by reference.

BACKGROUND

1. Field

Embodiments of the present invention relate to a display device.

2. Description of the Related Art

Electronic devices that provide images to a user, such as smart phones, digital cameras, laptop computers, navigators, and televisions, each include a display device for displaying the images. The display device includes a display panel for generating images and for displaying the images, and a window panel above the display panel to protect the display panel.

The image generated in the display panel may be transmitted through the window panel to be provided to a user. The window panel includes a display area on which the image is displayed, and includes a non-display area around the display area. The non-display area of the window panel may be designed to have various colors by using a printing layer. However, light reaching the printing layer through total reflection may be scattered around, and thus light leakage may be observed.

It is to be understood that this background section is intended to provide useful background for understanding the technology and, as such, the background section may include ideas, concepts, or recognitions that do not constitute prior art.

SUMMARY

Aspects of embodiments of the present invention are directed to a display device improved in light leakage phenomenon caused by total reflection.

According to one or more exemplary embodiments of the present invention, a display device includes a display panel configured to display an image, a window substrate above the display panel, and including a display area configured to transmit the image therethrough, and a non-display area around the display area, a first adhesive layer between the display panel and the window substrate, and a decoration film above an upper surface of the window substrate. The decoration film includes a base film and a printing layer at a first surface of the base film.

The window substrate may include a plastic substrate.

The display device may further include a hard coating layer at a second surface of the base film.

The display device may further include a step-difference compensation layer surrounded by portions of the printing layer at a lower surface of the decoration film.

The display device may further include a second adhesive layer between the window substrate and the decoration film.

The printing layer may contact the second adhesive layer.

The printing layer may correspond to the non-display area.

The display device may further include an auxiliary adhesive layer at a lower surface of the printing layer.

The auxiliary adhesive layer may contact the second adhesive layer.

The printing layer may include a first décor printing layer on the surface of the base film, and a light blocking printing layer on the first décor printing layer.

The light blocking printing layer may contact the second adhesive layer.

The first décor printing layer may include a white printing layer.

The light blocking printing layer may include a black printing layer.

The printing layer may further include a second décor printing layer between the light blocking printing layer and the first décor printing layer.

The second décor printing layer may include a pearl pigment and may have a transparent color.

The display panel may include a first substrate, a capping layer on the first substrate, and a thin film encapsulation (TFE) layer on the capping layer.

The display device may further include a polarizer on the thin film encapsulation layer, and facing the window substrate.

The first adhesive layer may be between the polarizer and the window panel.

The display device may further include a touch screen panel (TSP) on the polarizer.

The display panel may include an organic light emitting diode (OLED) display panel.

The foregoing is illustrative only, and is not intended to be in any way limiting. In addition to the illustrative aspects and embodiments described above, further aspects and embodiments will become apparent by reference to the drawings and the following detailed description.

BRIEF DESCRIPTION OF THE DRAWINGS

The above and other aspects of the present disclosure of invention will be more clearly understood from the following detailed description taken in conjunction with the accompanying drawings, in which.

DETAILED DESCRIPTION

Figure 1:
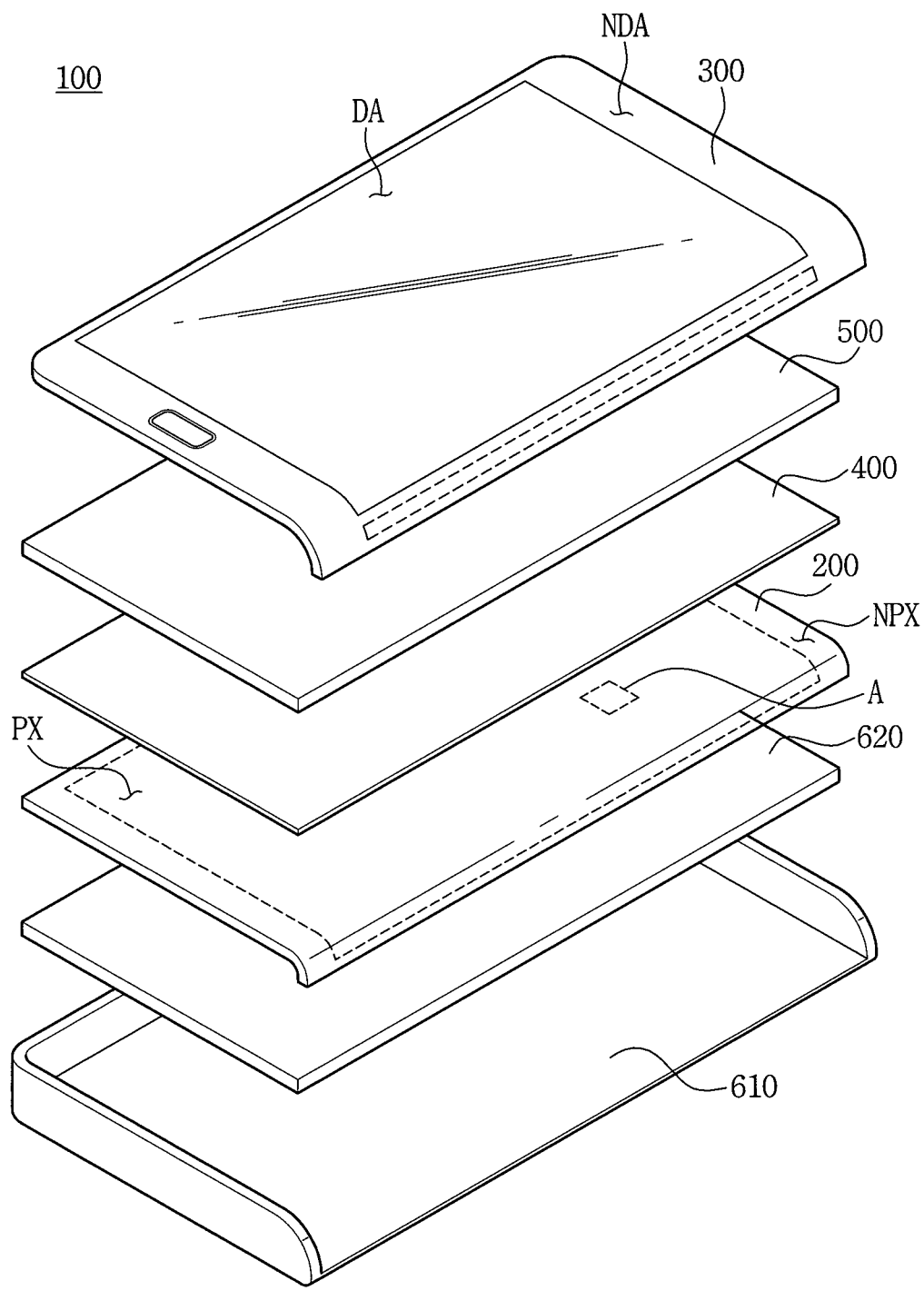
FIG. 1 is an exploded perspective view illustrating a display device according to one or more exemplary embodiments.

Aspects of the present invention and methods for achieving them will be made clear from embodiments described below with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular example embodiments only and is not intended to be limiting. It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

As used herein, the singular forms "a" and "an" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device 100 according to one or more exemplary embodiments is described with reference to FIGS. 1-4.

FIG. 1 is an exploded perspective view illustrating a display device 100 according to one or more exemplary embodiments.

Referring to FIG. 1, the display device 100 includes a display panel 200 on which a pixel region PX and a non-pixel region NPX are defined, a housing 610 that accommodates the display panel 200, an impact absorbing sheet 620 between the display panel 200 and the housing 610, a window panel 300 on which a display area DA and a non-display area NDA are defined, and a first adhesive layer 500 between the display panel 200 and the window panel 300. The window panel 300 is above the display panel 200.

The non-pixel region NPX is formed around the pixel region PX, and the non-display area NDA is formed around the display area DA. The pixel region PX of the display panel 200 corresponds to the display area DA of the window panel 300, and the non-pixel region NPX of the display panel 200 corresponds to the non-display area NDA of the window panel 300. In FIG. 1, for ease of description, the housing 610, the display panel 200, the window panel 300, and the first adhesive layer 500 are illustrated as being separated from each other.

The pixel region PX of the display panel 200 is defined as an area for generating and displaying an image. The non-pixel region NPX of the display panel 200 is defined as an area in which an image is not generated or displayed. The image generated in the display panel 200 may be transmitted through the window panel 300 to be provided to a user.

The type of the display panel 200 may not be particularly limited. For example, the display panel 200 may be a self-emission-type display panel, such as an organic light emitting diode ("OLED") display panel, or a non-emission-type display panel, such as a liquid crystal display ("LCD") panel and/or an electrophoretic display panel ("EPD"). The display panel 200 is described further below with reference to FIG. 6.

The housing 610 accommodates the display panel 200. As illustrated in FIG. 1, in some embodiments, the housing 610 may be a single unit that provides a space for accommodating the display panel 200. However, in other exemplary embodiments, the housing 610 may have a structure in which two or more units are coupled to one another.

The housing 610 may further include a circuit board on which a driving element is mounted, in addition to the display panel 200. Further, the housing 610 may further include a power unit, such as a battery.

The impact absorbing sheet 620 may be between the display panel 200 and the housing 610 to absorb impact that may be imposed on the display panel 200. Accordingly, the impact absorbing sheet 620 may prevent or reduce an external shock from being directly applied to the display panel 200. In some embodiments, the impact absorbing sheet 620 may be omitted.

The window panel 300 may be on (or at) a side (e.g., a first side) of the display panel 200 on which the image is displayed, and may be coupled to the housing 610 to form an exterior surface of the display device 100, along with the housing 610.

A polarizer 400 may be on the display panel 200, and in more detail, may be between the display panel 200 and the first adhesive layer 500. In addition, an additional adhesive layer may be between the polarizer 400 and the display panel 200 to attach the polarizer 400 to the display panel 200.

The polarizer 400 may prevent externally incident light (or external light) from being reflected off the display panel 200 to be perceived by a user. Accordingly, display quality degradation may be prevented or reduced in the display device 100 and visibility of the user may be improved by the polarizer 400.

In addition, the display device 100 may further include a touch screen panel. The touch screen panel may be on the display panel 200. For example, the touch screen panel may be between the display panel 200 and the polarizer 400, or may be on the polarizer 400. Based on an input signal applied from the touch screen panel, the display panel 200 may provide an image to a user corresponding to the input signal.

Figure 2:
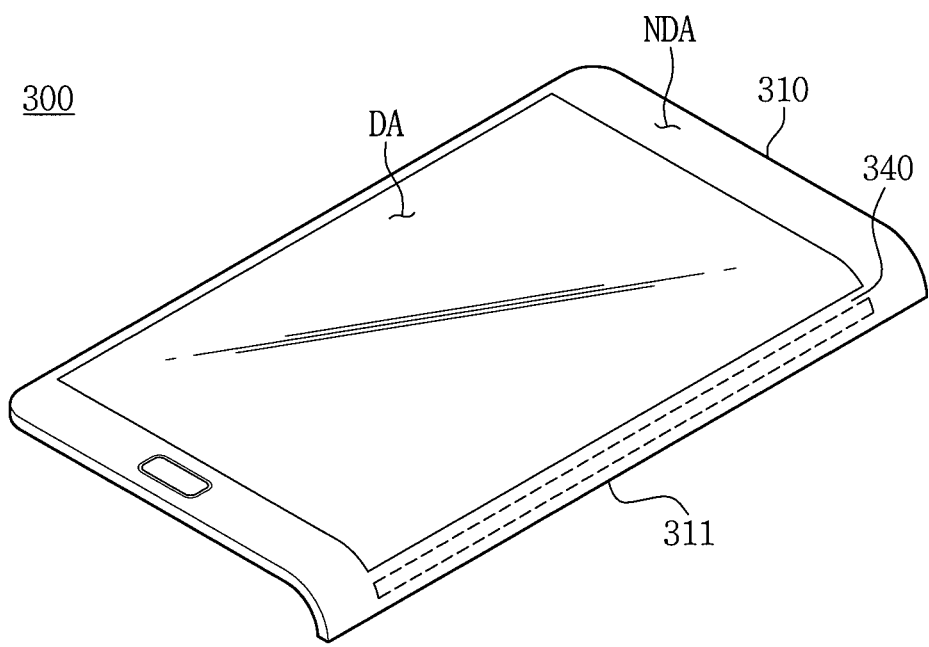
FIG. 2 is a perspective view illustrating a window of the display device of FIG. 1.
Figure 3:
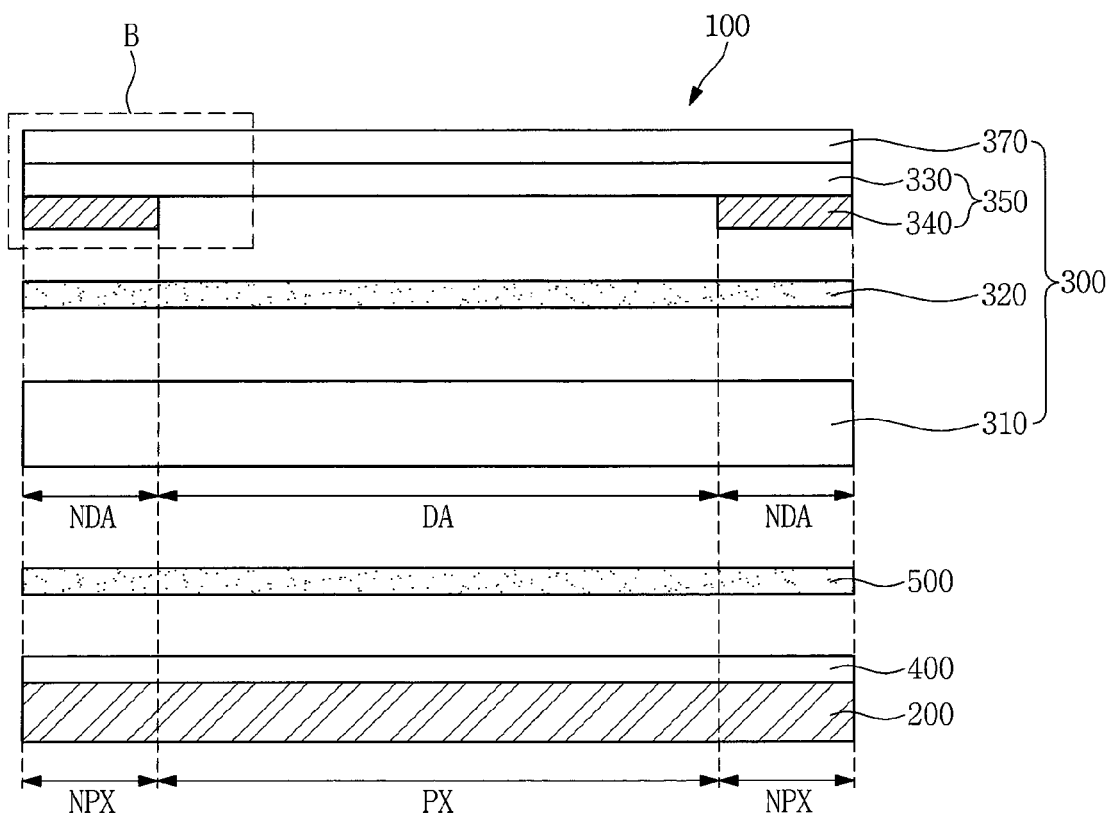
FIG. 3 is a cross-sectional view illustrating the display device according to one or more exemplary embodiments.

FIG. 2 is a perspective view illustrating the window panel 300 of FIG. 1, and FIG. 3 is a cross-sectional view illustrating the display device 100 according to one or more exemplary embodiments. The housing 610 and the impact absorbing sheet 620 are omitted in FIG. 3.

The window panel 300 is described below with reference to FIGS. 2 and 3.

The window panel 300 is above the display panel 200, and protects the display panel 200 from external scratches.

An upper planar surface of the window panel 300 includes a display area DA and a non-display area NDA formed around the display area DA. The display area DA is an area in which an image may be displayed (or provided) to an observer. The non-display area NDA is an area in which an image is not displayed. The non-display area NDA may be printed in black. However, the printing color of the non-display area NDA is not limited thereto, and the non-display area NDA may be printed in various colors. For example, in some exemplary embodiments, the non-display area NDA may be printed in white.

The window panel 300 may include a window substrate 310, a decoration film 350, a second adhesive layer 320 between the window substrate 310 and the decoration film 350, and a hard coating layer 370.

The window substrate 310 is above (or faces) the display panel 200. A planar area of the window substrate 310 includes the display area DA and the non-display area NDA around the display area DA, as described above, in the planar area of the window panel 300.

The window substrate 310 may include a transparent film that is configured to transmit light. Accordingly, the image generated in the pixel region PX of the display panel 200 may be transmitted through the window substrate 310 in the display area DA to be provided to a user.

The window substrate 310 may include (or may be formed of) plastic or glass having shock-resistance properties. The window substrate 310 may have a quadrangular plate shape, and corners of the quadrangular plate may be rounded. In some embodiments, as illustrated in FIG. 2, the window base 310 may have a structure in which a right edge portion 311 is curved. However, the present invention is not limited thereto, and the window substrate 310 may have various suitable shapes, such as a curved corner portion, a curved left edge portion, or the like.

A printing layer 340 may be on an upper surface of the window substrate 310 facing the display panel 200 in the non-display area NDA. That is, the non-display area NDA corresponds to an area including the printing layer 340, and the display area DA corresponds to an area in which the printing layer 340 is omitted.

Referring to FIG. 3, the decoration film 350 is above the window substrate 310. The second adhesive layer 320 may be between the decoration film 350 and the window substrate 310.

The decoration film 350 may include a base film 330, and the printing layer 340 on a surface of the base film 330.

The base film 330 may be a transparent film, such as a polyethylene terephthalate (PET) film. However, any transparent film that may transmit light may be applicable without limitation.

The printing layer 340 may be on a surface of the base film 330 in the non-display area NDA. In addition, the printing layer 340 may contact the second adhesive layer 320 between the window substrate 310 and the base film 330.

The printing layer 340 may include an organic material having a color (e.g., an organic material having a predetermined color). Accordingly, the color of the printing layer 340 may be displayed to a user in the non-display area NDA of the window substrate 310.

The printing layer 340 may also prevent or reduce visibility of an accommodation unit, which is configured to accommodate a driving unit for driving the display panel 200.

The printing layer 340 may have various colors including, for example, a black color or a white color. When the printing layer 340 has a black color, the printing layer 340 may include a black matrix. When the printing layer 340 has a white color, the printing layer 340 may include an organic insulating material, such as a white resin. In addition, the printing layer 340 may include an opaque inorganic insulating material, such as $CrO_x$ and/or $MoO_x$, and/or an opaque organic insulating material, such as a black resin. Accordingly, the printing layer 340 may block light in the display panel 200, may prevent visibility of an inner structure of the display panel 200, and may determine a color of a portion of the window panel 300.

The printing layer 340 may be formed by printing a printing composition on the base film 330, and the decoration film 350, which includes the printing layer 340, may be attached to the window substrate 310. However, the method of forming the printing layer 340 on the base film 330, and the method of disposing the decoration film 350 on a surface of the window substrate 310, are not limited thereto, and various suitable schemes (or processes) may be utilized.

The printing layer 340 may have a monolayer structure, but the present invention is not limited thereto. For example, the printing layer 340 may include a plurality of layers each having the same or different thicknesses.

Figure 4:
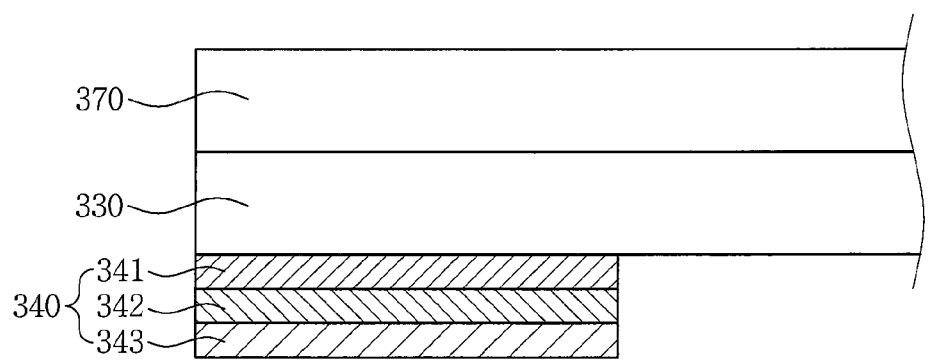
FIG. 4 is an enlarged view illustrating the portion B of FIG. 3.

FIG. 4 is an enlarged view illustrating the portion B of FIG. 3. A detailed configuration of the printing layer 340 is illustrated in FIG. 4.

Referring to FIG. 4, the printing layer 340 includes a plurality of printing layers 341, 342, and 343 (e.g., a first décor printing layer 341, a second décor printing layer 342, and a light blocking printing layer 343) on a surface of the base film 330 in the non-display area NDA.

The first décor printing layer 341 may be a white printing layer, but the present invention is not limited thereto. In alternative exemplary embodiments, the first décor printing layer 341 may have various colors other than a white color. Further, the first décor printing layer 341 may include a single layer, or may include a plurality of layers having the same color to provide a more distinct (or vibrant) color.

The second décor printing layer 342 may have a transparent color, and may include a pearl pigment having a glittering characteristic. As such, the second décor printing layer 342 may provide a visible glittering effect to a user. The second décor printing layer 342 may include a pigment representing various textures, in addition to, or instead of, the pearl pigment.

The light blocking printing layer 343 may be a black printing layer. The light blocking printing layer 343 having a black color may have a light blocking ratio that is higher than those of the first décor printing layer 341 and the second décor printing layer 342.

Although three printing layers 341, 342, and 343 are illustrated in FIG. 4 by way of example, the present invention is not limited thereto. In alternative exemplary embodiments, more than three printing layers may be on a first surface of the base film 330 in the non-display area NDA.

The hard coating layer 370 may be on a second surface of the base film 330 opposite to the first surface. The hard coating layer 370 may use any coating composition capable of enhancing the surface hardness of the window base 310. For example, the hard coating layer 370 may include an ultraviolet (UV) curable coating composition that may not require a high-temperature treatment.

The hard coating layer 370 may include an acrylate-based monomer and/or an inorganic chemical compound. The hard coating layer 370 is on the second surface of the base film 330, and may enhance the surface hardness and chemical-resistance properties of the window substrate 310.

In some embodiments, a passivation layer may be on the hard coating layer 370. The passivation layer may be a functional coating layer, including an anti-finger (AF) coating layer, an anti-reflection (AR) coating layer, and/or an anti-glare (AG) coating layer.

The printing layer 340 may contact the first adhesive layer 500 interposed between the display panel 200 and the window panel 300.

The first adhesive layer 500 is between the polarizer 400 and the window panel 300, and may allow the display panel 200 and the window panel 300 to be firmly coupled to each other.

The first adhesive layer 500 may be formed of an optically clear adhesive ("OCA") so that the first adhesive layer 500 is not likely to decrease luminance of light emitted from the display panel 200. The first adhesive layer 500 may be formed of a transparent polymer resin that has adhesion and is photocurable or thermocurable. For example, the first adhesive layer 500 may be formed of a photocurable resin that may be cured by light irradiation.

A pixel of the display panel 200 is described below with reference to FIGS. 5 and 6.

Figure 5:
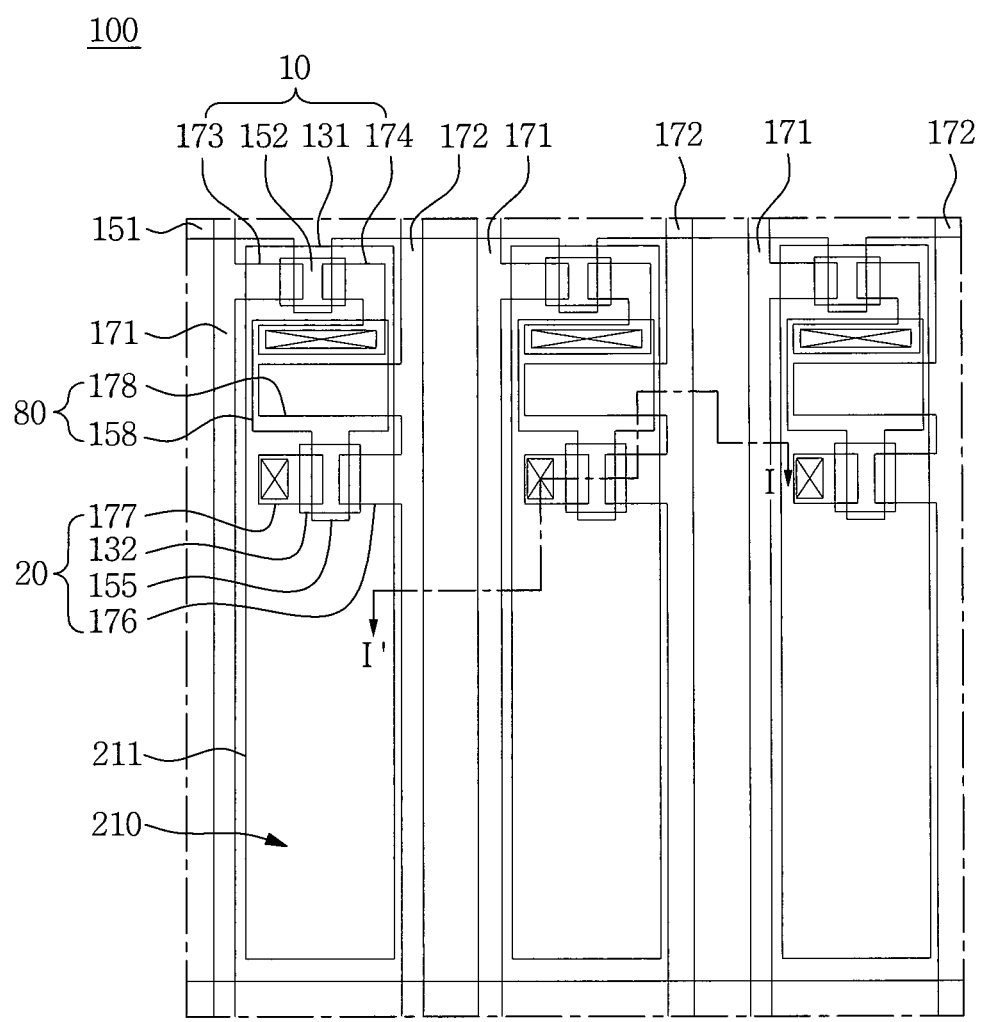
FIG. 5 is a schematic plan view illustrating a pixel of a display panel in the portion A of FIG. 1.
Figure 6:
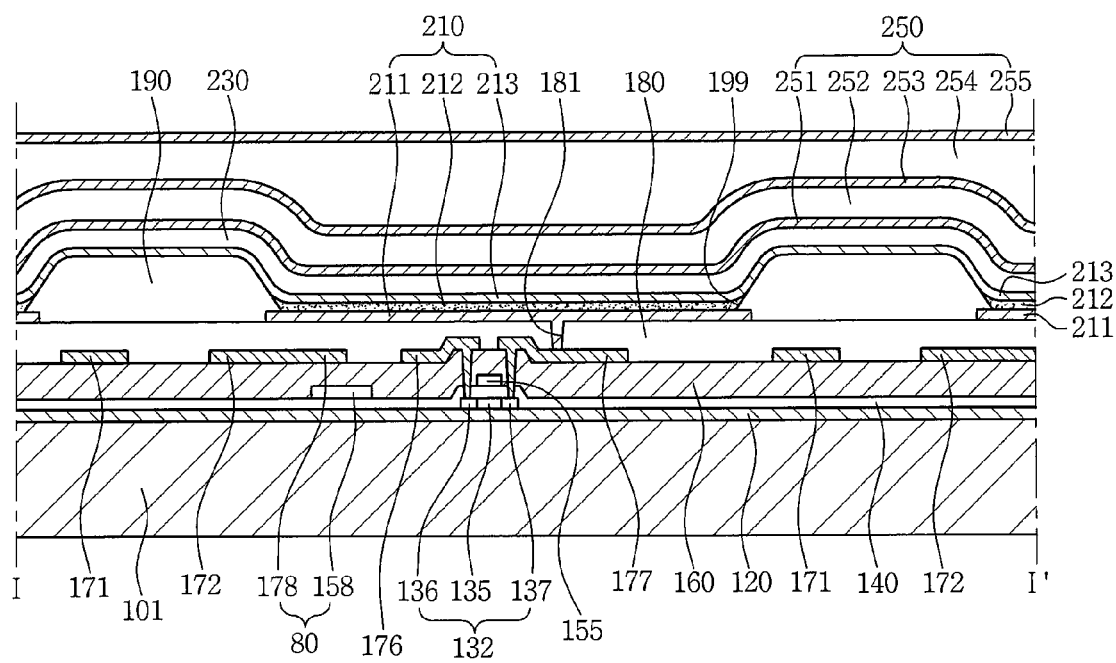
FIG. 6 is a cross-sectional view taken along the line I-I' of FIG. 5.

FIG. 5 is a schematic plan view illustrating a pixel of a display panel in the portion A of FIG. 1, and FIG. 6 is a cross-sectional view taken along the line I-I' of FIG. 5.

In some embodiments, as illustrated in FIGS. 5 and 6, each pixel in the display area DA (see FIG. 1) may include an active-matrix type organic light emitting diode (AMOLED) device having a 2Tr-1 Cap structure including two thin film transistors ("TFTs") 10 and 20 and a capacitor 80, but the present invention is not limited thereto.

For example, the OLED display device 100 may include three or more TFTs and two or more capacitors 80 in each pixel, and may further include additional wirings to have various suitable configurations. As used herein, the term "pixel" refers to the smallest unit for displaying an image, and the display area displays an image using a plurality of pixels.

The OLED display device 100 according to one or more exemplary embodiments includes a first substrate 101, and a plurality of pixels defined on the first substrate 101. Each pixel includes a switching TFT 10, a driving TFT 20, the capacitor 80, and an OLED 210. The first substrate 101 may further include a gate line 151 extending along a first direction, and a data line 171 and a common power line 172 that are insulated from and that cross the gate line 151.

Each pixel may be defined by the gate line 151, the data line 171, and the common power line 172, but the present invention is not limited thereto.

The OLED 210 includes a first electrode 211, an organic light emitting layer 212 on the first electrode 211, and a second electrode 213 on the organic light emitting layer 212.

Herein, the first electrode 211 may be a positive end (or an anode) serving as a hole injection electrode; and the second electrode 213 may be a negative end (or a cathode) serving as an electron injection electrode. However, the present invention is not limited thereto. For example, the first electrode 211 may be a cathode and the second electrode 213 may be an anode, based on the driving scheme of the OLED display device 100.

Holes and electrons injected into the organic light emitting layer 212 are combined with each other to form excitons, and then light is emitted by energy generated when the excitons fall from an excited state to a ground state.

The capacitor 80 includes a pair of storage electrodes 158 and 178, with an insulating layer 160 interposed therebetween. The insulating layer 160 may include a dielectric material. The capacitance of the capacitor 80 is determined by electric charges accumulated in the capacitor 80 and voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may function as a switching element that selects a pixel to perform light emission. The switching gate electrode 152 is connected to the gate line 151, and the switching source electrode 173 is connected to the data line 171. The switching drain electrode 174 is spaced apart from the switching source electrode 173, and is connected to the first storage electrode 158.

The driving TFT 20 applies a driving power to the first electrode 211, which allows the organic light emitting layer 212 of the OLED 210 in a selected pixel to emit light. The driving gate electrode 155 is connected to the first storage electrode 158, which is connected to the switching drain electrode 174. The driving source electrode 176 and the second storage electrode 178 are each connected to the common power line 172. The driving drain electrode 177 is connected to the first electrode 211 of the OLED 210 through a drain contact opening (e.g., a drain contact hole) 181.

With the above-described configuration, the switching TFT 10 may be operated by a gate voltage applied to the gate line 151, and may transmit a data voltage applied from the data line 171 to the driving TFT 20.

Voltage that is equivalent to a difference between a common voltage applied from the common power line 172 to the driving TFT 20, and the data voltage transmitted from the switching TFT 10, may be stored in the capacitor 80, and current corresponding to the voltage stored in the capacitor 80 may flow to the OLED 210 through the driving TFT 20, so that the OLED 210 may emit light.

The configuration of the OLED display device 100 according to one or more exemplary embodiments is described further below with reference to FIGS. 5 and 6.

According to one or more exemplary embodiments, the first substrate 101 may include an insulating substrate formed of glass, quartz, ceramic, plastic, or the like. However, the present invention is not limited thereto, and the first substrate 101 may include, for example, a metal substrate including stainless steel or the like.

A buffer layer 120 is formed on the first substrate 101. The buffer layer 120 may significantly reduce infiltration of undesirable elements, and may planarize a surface of the first substrate 101. However, the buffer layer 120 may be omitted based on the type of the first substrate 101 that is utilized and process conditions thereof.

The driving semiconductor layer 132 is formed on the buffer layer 120. The driving semiconductor layer 132 includes a channel region 135 that is not doped with impurities, and includes p+ doped source and drain regions 136 and 137 that are formed on respective sides of the channel region 135.

A gate insulating layer 140 is formed on the driving semiconductor layer 132. The driving gate electrode 155, the gate line 151 (refer to FIG. 6), and the first storage electrode 158 are formed on the gate insulating layer 140. The driving gate electrode 155 may overlap at least a portion of the driving semiconductor layer 132. For example, the driving gate electrode 155 may overlap the channel region 135. The driving gate electrode 155 may prevent the channel region 135 from being doped with impurities when the source and drain regions 136 and 137 of the driving semiconductor layer 132 are doped with the impurities during forming of the driving semiconductor layer 132.

The insulating layer 160 is formed on the gate insulating layer 140 to cover the driving gate electrode 155. The insulating layer 160 may be an insulating interlayer. The gate insulating layer 140 and the insulating layer 160 may each have contact openings (e.g., contact holes) to expose the source and drain regions 136 and 137 of the driving semiconductor layer 132.

The driving source electrode 176, the driving drain electrode 177, the data line 171, the common power line 172, and the second storage electrode 178 are on the insulating layer 160 in the display area DA. The driving source electrode 176 and the driving drain electrode 177 are respectively connected to the source region 136 and the drain region 137 of the driving semiconductor layer 132 through the contact holes.

A passivation layer 180 is formed on the insulating layer 160 to cover the driving source electrode 176, the driving drain electrode 177, and the like. The passivation layer 180 may be a planarization layer.

The passivation layer 180 may define a drain contact opening (e.g., a drain contact hole) 181 that exposes the driving drain electrode 177. The first electrode 211 is on the passivation layer 180, and the first electrode 211 is connected to the driving drain electrode 177 through the drain contact hole 181 of the passivation layer 180.

A pixel defining layer 190 is formed on the passivation layer 180 to cover the first electrode 211. The pixel defining layer 190 may have an aperture 199 that exposes the first electrode 211. For example, the first electrode 211 may correspond to the aperture 199 of the pixel defining layer 190.

The organic light emitting layer 212 is formed on the first electrode 211 within the aperture 199 of the pixel defining layer 190, and the second electrode 213 may be formed on the pixel defining layer 190 and the organic light emitting layer 212.

One of the first electrode 211 and the second electrode 213 may be formed of a transparent conductive material, and the other of the first electrode 211 and the second electrode 213 may be formed of a transflective or reflective conductive material. Depending on the material of the first electrode 211 and the second electrode 213, the OLED display device 100 may become a top-emission type, a bottom-emission type, or a both-side-emission type.

The organic light emitting layer 212 may have a multilayer structure including a light emitting layer and at least one of a hole injection layer ("HIL"), a hole transporting layer ("HTL"), an electron transporting layer ("ETL") and an electron injection layer ("EIL").

A capping layer 230 may further be on the second electrode 213. The capping layer 230 may protect the OLED 210, and may allow the light generated in the organic light emitting layer 212 to be efficiently externally emitted.

The OLED display device 100 according to one or more exemplary embodiments may further include a thin film encapsulation layer 250 on the capping layer 230.

The thin film encapsulation layer 250 includes one or more inorganic layers 251, 253, and 255 and one or more organic layers 252 and 254. The thin film encapsulation layer 250 has a structure in which the inorganic layers 251, 253, and 255 and the organic layers 252 and 254 are alternately stacked. In some embodiments, the inorganic layer 251 may be a lowermost layer of the stacked structure of the thin film encapsulation layer 250. In other words, the inorganic layer 251 may be the closest to the OLED 210. Although FIG. 6 illustrates the thin film encapsulation layer 250 as including the three inorganic layers 251, 253, and 255 and the two organic layers 252 and 254, the present invention is not limited thereto.

The thin film encapsulation layer 250 may have a thickness of about 10 μm or less. Accordingly, an overall thickness of the OLED display device 100 may be significantly reduced.

When the thin film encapsulation layer 250 is on the OLED 210, an additional substrate might not be provided on the thin film encapsulation layer 250. When the additional substrate is omitted, the flexibility of the display panel 200 may be improved.

A conventional display device in which a light leakage phenomenon occurs is described below with reference to FIGS. 7-9.

Figure 7:
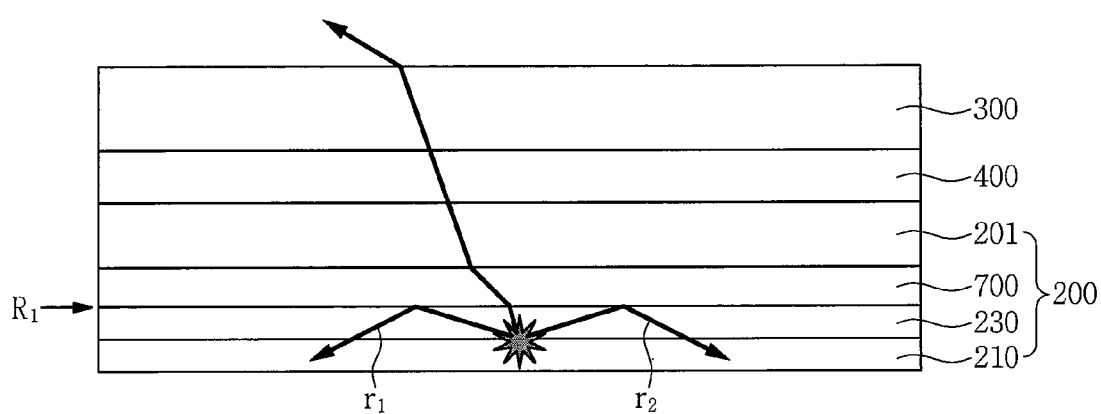
FIG. 7 is a cross-sectional view illustrating a portion of a conventional flat display device.
Figure 8:
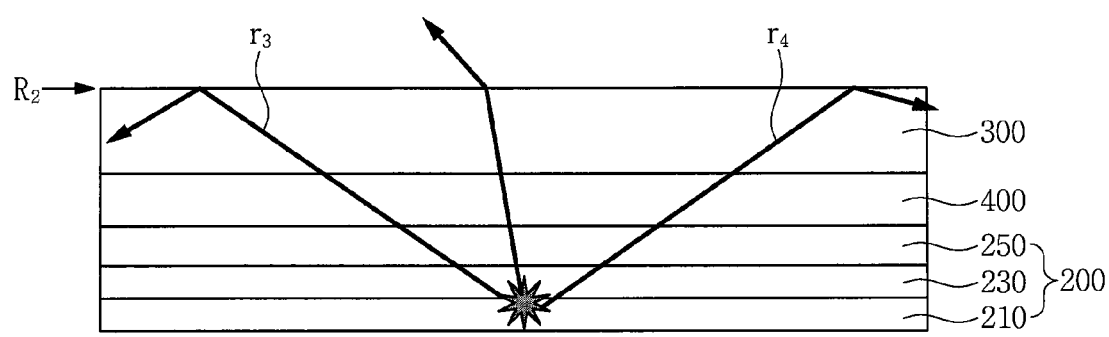
FIG. 8 is a cross-sectional view illustrating a portion of a conventional curved display device.
Figure 9:
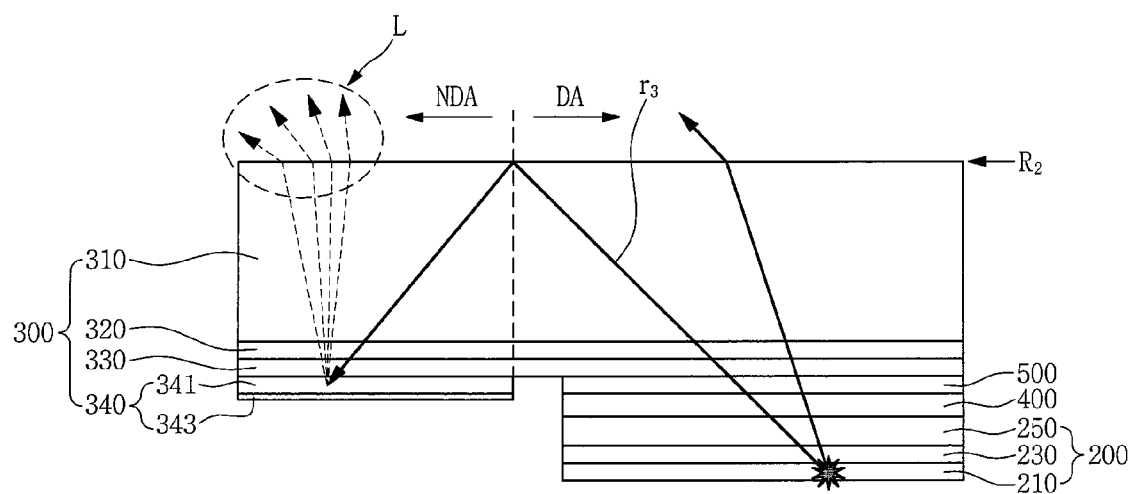
FIG. 9 is a cross-sectional view illustrating a light path inducing light leakage of the conventional curved display device of FIG. 8.

FIG. 7 is a cross-sectional view illustrating a portion of a conventional flat display device, FIG. 8 is a cross-sectional view illustrating a portion of a conventional curved display device, and FIG. 9 is a cross-sectional view illustrating a light path inducing light leakage of the conventional curved display device. The housing 610 and the impact absorbing sheet 620 are omitted in FIGS. 7, 8, and 9 for clarity.

A display panel 200 of the conventional flat display device illustrated in FIG. 7 includes an OLED 210, a capping layer 230 above the OLED 210, an encapsulation substrate 201 above the capping layer 230, a polarizer 400, and a window panel 300. In addition, an air layer 700 may be formed between the capping layer 230 and the encapsulation substrate 201.

The encapsulation substrate 201 covers the OLED 210, etc., to protect the OLED 210 and other internal layers from an external environment. The encapsulation substrate 201 may use an insulating substrate formed of glass, plastic, or the like. When the display device is a top-emission type device, in which images are displayed toward the encapsulation substrate 201, the encapsulation substrate 201 may be formed of a light-transmissive material.

When the encapsulation substrate 201 is above the capping layer 230, and when the air layer 700 is formed, a total-reflection interface $R_1$ corresponds to an interface between the air layer 700, which has a low refractive index, and the capping layer 230, which has a high refractive index. Accordingly, totally reflected lights $r_1$ and $r_2$ are reflected off the total-reflection interface $R_1$, and do not reach the window panel 300, and are instead trapped below the air layer 700, and light leakage caused by the totally reflected lights $r_1$ and $r_2$ may not be observed.

On the contrary, when the display device includes a thin film encapsulation layer 250 on the capping layer 230, as illustrated in FIGS. 8 and 9, a total-reflection interface $R_2$ is formed between a surface of the window panel 300 and the outside of the display device. Accordingly, totally reflected lights $r_3$ and $r_4$ reach the surface of the window panel 300 that corresponds to the total-reflection interface $R_2$.

Referring to FIG. 9, the totally reflected light $r_3$ that reaches a surface of the window substrate 310 is guided by the total-reflection interface $R_2$ to reach the printing layer 340. The totally reflected light $r_3$ that reaches the printing layer 340 is scattered by a first décor printing layer 341 (e.g., a white printing layer) to be externally emitted, and thus light leakage L is observed in the non-display area NDA of the window panel 300.

Effects of light leakage improvement are described further below with reference to FIGS. 10 and 11.

Figure 10:
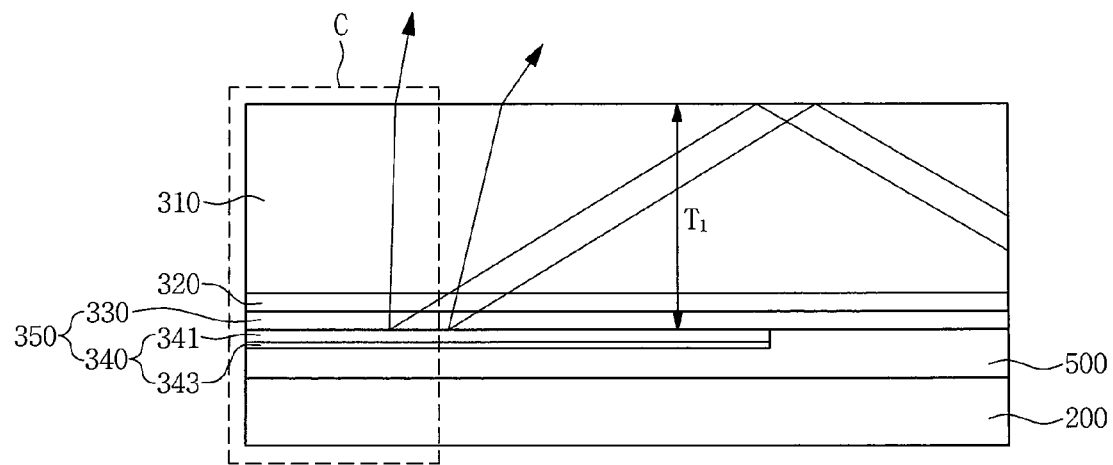
FIG. 10 is a cross-sectional view illustrating a light path inducing light leakage and a thickness T1 of a light guide path of a conventional display device.
Figure 11:
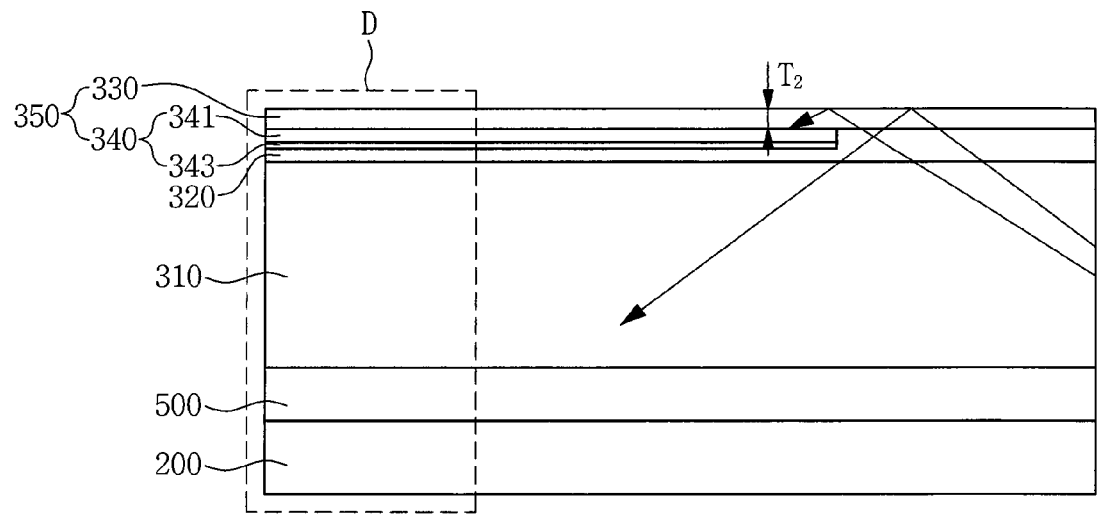
FIG. 11 is a cross-sectional view illustrating a light path inducing light leakage and a thickness T2 of a light guide path of a display device according to one or more exemplary embodiments.

FIG. 10 is a cross-sectional view illustrating a light path inducing light leakage and a thickness $T_1$ of a light guide path of a conventional display device, and FIG. 11 is a cross-sectional view illustrating a light path inducing light leakage and a thickness $T_2$ of a light guide path of a display device according to one or more exemplary embodiments.

In the conventional display device illustrated in FIG. 10, a window substrate 310 is at an outermost portion of the display device, and a decoration film 350 is below the window substrate 310. In more detail, the window substrate 310, a second adhesive layer 320, a base film 330, and a printing layer 340 are provided sequentially.

However, in the display device according to one or more exemplary embodiments illustrated in FIG. 11, the decoration film 350 is at an outermost portion of the display device (e.g., the display device 100), and the window substrate 310 is below the decoration film 350. In more detail, the base film 330, the printing layer 340, the second adhesive layer 320, and the window substrate 310 are provided sequentially.

In other words, the display device according to one or more exemplary embodiments has a structure in which the position of the window substrate 310 and the decoration film 350 is inverted, as compared to a structure of those in the conventional display device.

In FIGS. 10 and 11, the printing layers 340 are illustrated as including two layers 341 and 343 having same thicknesses, for example, the first décor printing layer 341 and the light blocking printing layer 343 each have the same thickness. However, the present invention is not limited thereto, and the printing layer 340 may have a monolayer structure or a multilayer structure including a plurality of layers having different thicknesses.

A light path inducing light leakage is as follows. First, light is generated in the OLED 210, and totally reflected at an outermost optical interface. Subsequently, the totally reflected light reaches the printing layer 340 to be scattered at the printing layer 340. Then, the scattered light is externally emitted to be observed as light leakage. Herein, a distance between the outermost optical interface and the printing layer 340 may be defined as a thickness T of the light guide path.

Referring to FIG. 10, in the conventional display device, the outermost optical interface corresponds to a surface of the window substrate 310, and the light generated in the OLED is totally reflected at an upper surface of the window substrate 310, reaches the printing layer 340 (e.g., the first décor printing layer 341), and then is scattered to be externally emitted. Accordingly, in the conventional display device, the thickness $T_1$ of the light guide path causing light leakage is the same as an overall thickness from the upper surface of the window substrate 310 to a surface of the printing layer 340.

Referring to FIG. 11, in the display device according to one or more exemplary embodiments, the outermost optical interface corresponds to a surface of the base film 330, and the light generated in the OLED is totally reflected at an upper surface of the base film 330, reaches the printing layer 340, for example, the first décor printing layer 341, and then is scattered to be externally emitted. Accordingly, in the display device 100 according to one or more exemplary embodiments, the thickness $T_2$ of the light guide path causing light leakage is the same as an overall thickness from the upper surface of the base film 330 to a surface of the printing layer 340, that is, a thickness of the base film 330.

Based on a comparison of FIGS. 10 and 11, it is verified that the thickness $T_2$ of the light guide path of the display device according to one or more exemplary embodiments is less than the thickness $T_1$ of the light guide path of the conventional display device ($T_1 > T_2$), and an amount of light totally reflected at the outermost interface to reach the printing layer 340 is less in the display device 100 according to one or more exemplary embodiments than in the conventional display device. In more detail, as the thickness T of the light guide path causing light leakage decreases, the amount of light reaching the printing layer 340 is reduced, and accordingly, the amount of light scattered and externally emitted is reduced.

Hereinafter, the respective thicknesses of the light guide paths in the conventional display device and the display device according to one or more exemplary embodiments are described with reference to an example.

Figure 12:
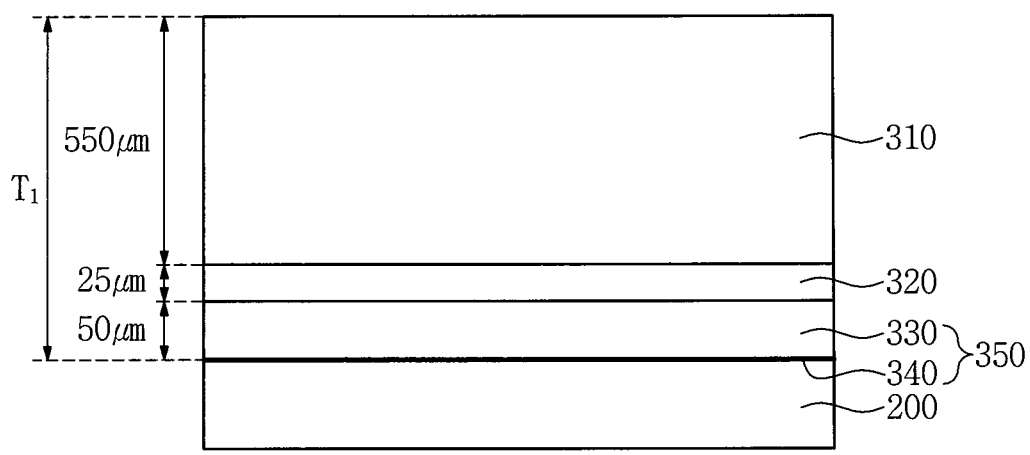
FIG. 12 is a schematic cross-sectional view illustrating the portion C of FIG. 10.
Figure 13:
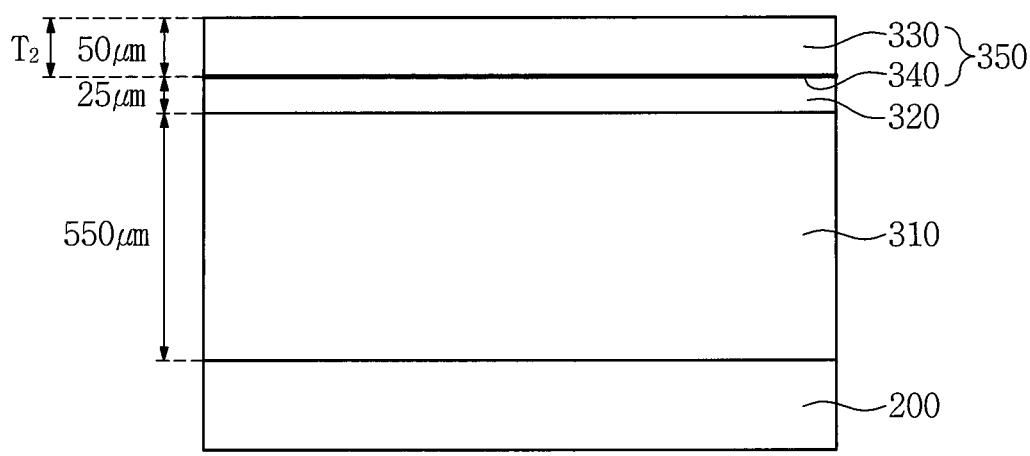
FIG. 13 is a schematic cross-sectional view illustrating the portion D of FIG. 11.

FIG. 12 is a schematic cross-sectional view illustrating the portion C of FIG. 10, and FIG. 13 is a schematic cross-sectional view illustrating the portion D of FIG. 11. In FIGS. 12 and 13, a thickness of the window substrate 310, the second adhesive layer 320, and the base film 330 is illustrated by way of example.

Referring to FIG. 12, the thickness $T_1$ of the light guide path causing light leakage in the conventional display device is about 625 μm, which is a sum of a thickness of the window substrate 310 of about 550 μm, a thickness of the second adhesive layer 320 of about 25 μm, and a thickness of the base film 330 of about 50 μm.

Referring to FIG. 13, the thickness $T_2$ of the light guide path causing light leakage in the display device according to one or more exemplary embodiments is about 50 μm, which is the thickness of the base film 330.

As illustrated in FIGS. 12 and 13, the thickness $T_2$ of the light guide path in the display device according to one or more exemplary embodiments is about 50 μm, which is about 8% of the thickness T1 of the light guide path of about 625 μm in the conventional display device.

As described in the foregoing, as the display device according to one or more exemplary embodiments has a structure in which the position of the window substrate 310 and the decoration film 350 is inverted, the printing layer 340 is adjacent the outermost portion of the display device, such that the thickness $T_2$ of the light path causing light leakage may decrease, and the amount of light incident to the printing layer 340 to be scattered may be reduced. Accordingly, the display device according to one or more exemplary embodiments may bring about effects of light leakage improvement.

Figure 14A:
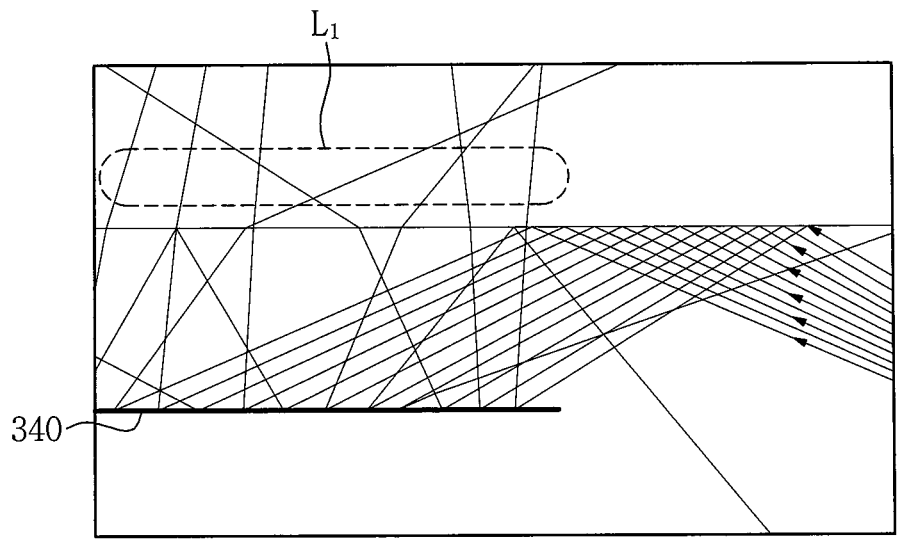
FIG. 14A is a schematic view illustrating a result from an optical simulation of a light leakage level of the conventional display device.
Figure 14B:
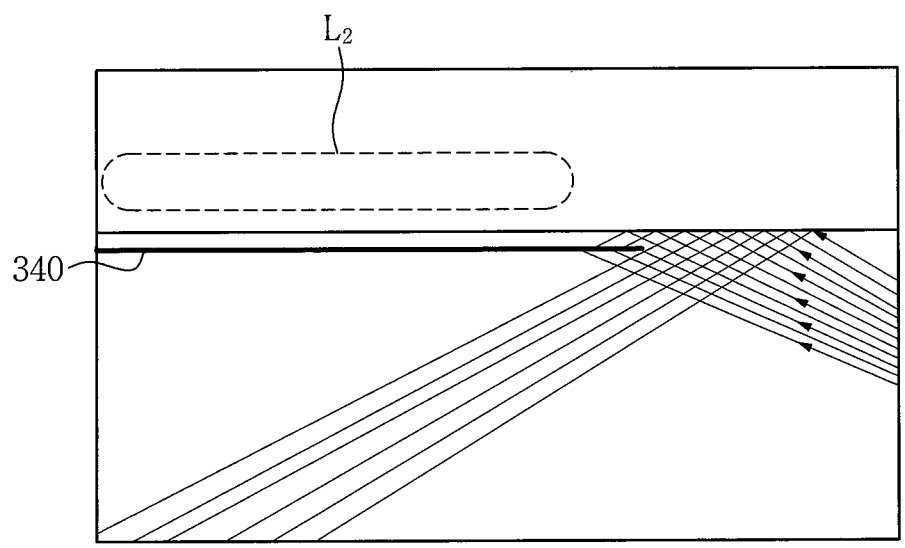
FIG. 14B is a schematic view illustrating a result from an optical simulation of a light leakage level of the display device according to one or more exemplary embodiments.

FIGS. 14A and 14B respectively illustrate a result from an optical simulation comparing a light leakage level between the conventional display device and the display device according to one or more exemplary embodiments.

FIG. 14A illustrates a result from a simulation measuring light leakage in the non-display area NDA of the conventional display device, and FIG. 14B illustrates a result from a simulation measuring light leakage in the non-display area NDA of the display device according to one or more exemplary embodiments.

Referring to FIG. 14A, it is verified that an amount of light, which reaches the printing layer 340 and is scattered and externally emitted to be observed as light leakage $L_1$, is relatively great in the conventional display device. On the other hand, in reference to a result from the simulation illustrated in FIG. 14B, it is verified that an amount of light that reaches the printing layer 340 and that is scattered and externally emitted to be observed as light leakage $L_2$, is significantly reduced in the display device according to one or more exemplary embodiments.

Figure 15:
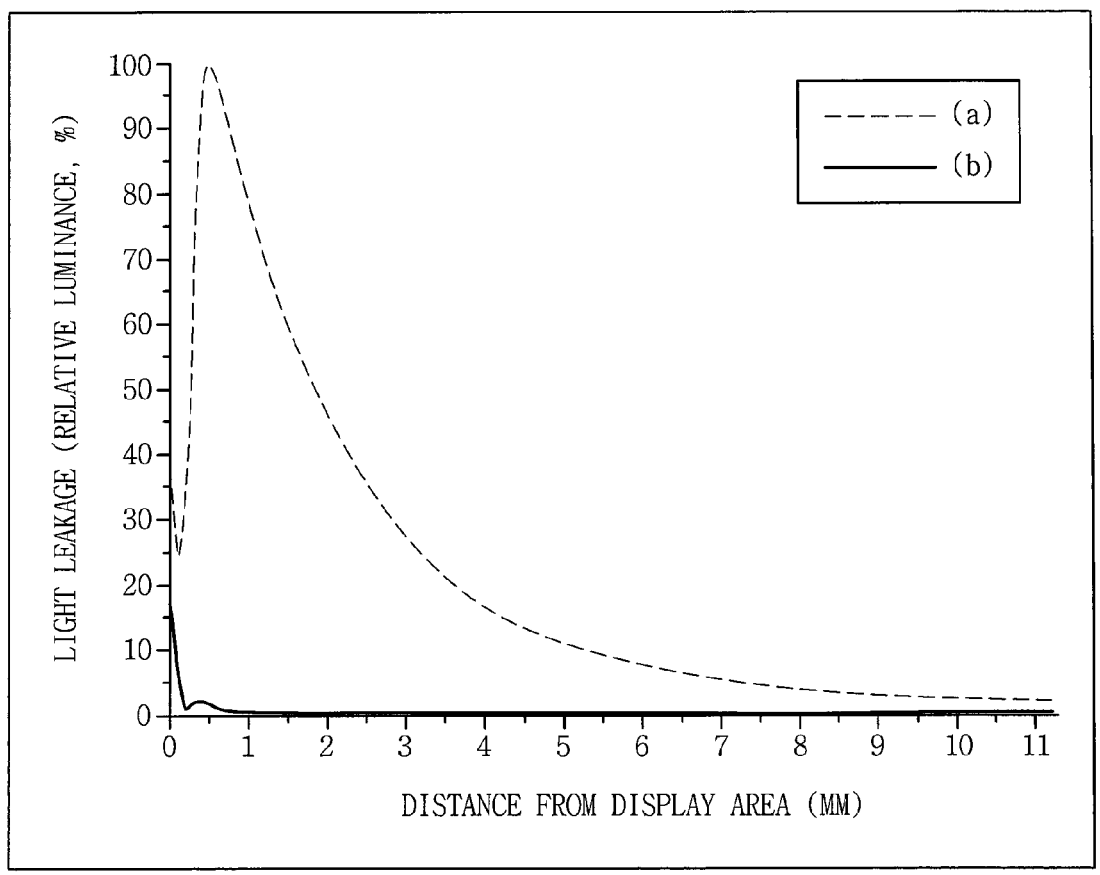
FIG. 15 is a graph comparing a light leakage level between the conventional display device and the display device according to one or more exemplary embodiments.

FIG. 15 is a graph comparing a light leakage level between the conventional display device and the display device according to one or more exemplary embodiments.

The graphs in FIG. 15 illustrate results from measurement of a relative luminance (%) in a direction perpendicular to a light-leakage area, e.g., an upper surface of the non-display area NDA. The x-axis represents a distance in millimeters (mm) from the display area DA, and the y-axis represents a light leakage in percent relative luminance (%). In FIG. 15, dashed line (a) shows a value measured in the conventional display device, and solid line (b) shows a value measured in the display device according to embodiments the present invention.

Referring to FIG. 15, while a maximum light leakage (%) is about 100% at a distance of about 0.55 mm from the display area DA in the conventional display device, the light leakage is measured to be about 2% at the same position in the display device according to one or more exemplary embodiments. In addition, a maximum light leakage (%) is about 17% at a distance of about 0 mm from the display area DA in the display device according to one or more exemplary embodiments.

Accordingly, it is verified from the result that the maximum light leakage (%) is reduced by about 83% in the display device according to one or more exemplary embodiments when compared to that of the conventional display device. In addition, it is verified that at the position where the maximum light leakage is observed in the conventional display device, the light leakage is improved by about 98% in the display device according to one or more exemplary embodiments.

Figure 16:
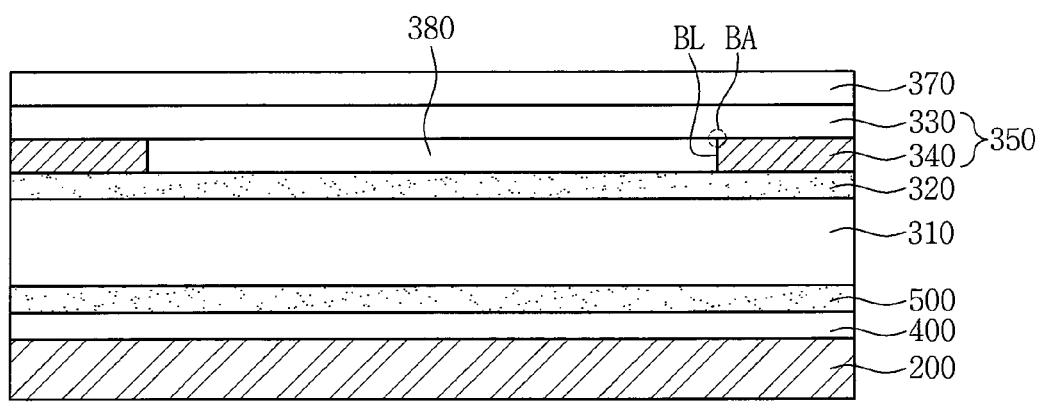
FIG. 16 is a cross-sectional view illustrating a display device according to one or more exemplary embodiments.

FIG. 16 is a cross-sectional view illustrating a display device according to one or more exemplary embodiments.

The display device according to one or more exemplary embodiments has a configuration that is the same or substantially the same as that of the display device illustrated in FIG. 3, with the exception of additionally including a step-difference compensation layer 380. Accordingly, configurations different from those illustrated in FIG. 3 may be described below, and the same configurations may be represented by the same reference numerals.

Referring to FIG. 16, the display device according to one or more exemplary embodiments may further include the step-difference compensation layer 380.

The step-difference compensation layer 380 may be surrounded by the printing layers 340 on a lower surface of the decoration film 350. In more detail, the step-difference compensation layer 380 is on (or at) the lower surface of the base film 330 in the display area DA, and is between respective portions of the printing layers 340 in the non-display area NDA. At a boundary surface BL between the display area DA and the non-display area NDA, an inner side surface of the printing layer 340 and a side surface of the step-difference compensation layer 380 contact each other.

The second adhesive layer 320 is between the step-difference compensation layer 380 and the window substrate 310. The step-difference compensation layer 380 and the window substrate 310 are attached to each other by the second adhesive layer 320. That is, the step-difference compensation layer 380 and the second adhesive layer 320 contact each other.

When the second adhesive layer 320 directly contacts the decoration film 350, an adhesive member that forms the second adhesive layer 320 might not be coated in a vertical boundary area BA formed between a lower surface of the base film 330 and the inner side surface of the printing layer 340. For example, a space (e.g., a predetermined space) may be formed in the vertical boundary area BA, thus causing adhesion defects. As such, adhesion defects may occur in the vertical boundary area BA due to a step-difference between the printing layer 340 and the base film 330 formed by the thickness of the printing layer 340 in the non-display area NDA.

The step-difference compensation layer 380 contacts the inner side surface of the printing layer 340 at the boundary surface BL between the display area DA and the non-display area NDA. Accordingly, the predetermined space may be absent at the vertical boundary area BA. Because the predetermined space is absent at the vertical boundary area BA, defects caused by the step-difference due to the printing layer 340 may be improved.

The step-difference compensation layer 380 may be a resin, for example, a photocurable resin. When a photoinitiator included in the resin in a small amount receives light, for example, ultraviolet (UV) light, photopolymerization reaction may be initiated so that a monomer and an oligomer that are primary materials of the resin may instantaneously form a polymer to be cured. The step-difference compensation layer 380, for example, may use a photocurable resin, but any suitable transparent material is applicable without limitation.

Figure 17:
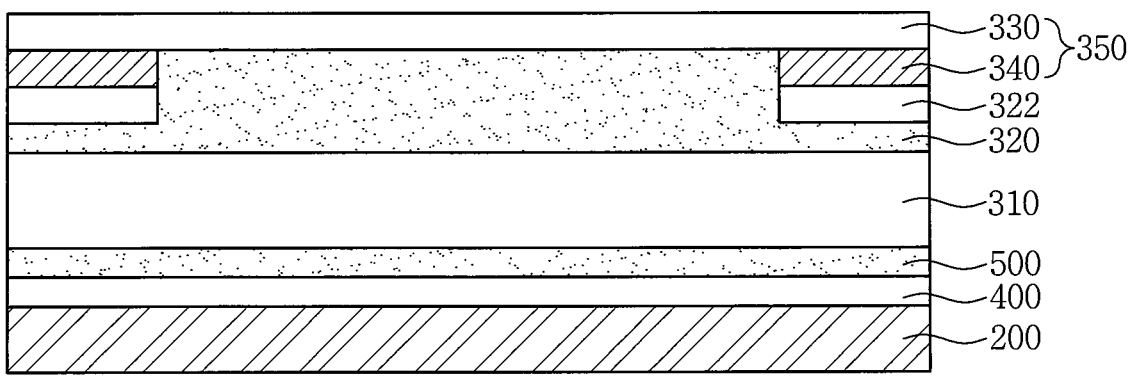
FIG. 17 is a cross-sectional view illustrating a display device according to one or more exemplary embodiments.

FIG. 17 is a cross-sectional view illustrating a display device according to one or more exemplary embodiments.

The display device according to one or more exemplary embodiments has a configuration that is the same as or substantially the same as that of the display device illustrated in FIG. 3, but also includes an auxiliary adhesive layer 322. Accordingly, the same or substantially the same configurations may be represented by the same reference numerals, and repetitive description may be omitted.

Referring to FIG. 17, the display device according to one or more exemplary embodiments may further include the auxiliary adhesive layer 322. The auxiliary adhesive layer 322 may be on the printing layer 340 in the non-display area NDA, and the auxiliary adhesive layer 322 may contact the second adhesive layer 320. The auxiliary adhesive layer 322 forms a covalent bond with materials forming the printing layer 340 and the second adhesive layer 320, thus enhancing adhesion at an interface between the printing layer 340 and the second adhesive layer 320.

In the present exemplary embodiment, the auxiliary adhesive layer 322 may include a photocurable acrylate-based oligomer, a photocurable acrylate-based monomer, a rubber-based polymer, a photoinitiator, and/or a silane coupling agent.

The photocurable acrylate-based oligomer is cured by light such as UV light, and may provide a cohesive force for an interface bonding between the printing layer 340 and the second adhesive layer 320. The photocurable acrylate-based monomer may decrease the viscosity of the auxiliary adhesive layer 322 to allow the auxiliary adhesive layer 322 to be readily coated on the printing layer 340. The rubber-based polymer may provide flexibility to the auxiliary adhesive layer 322. The photoinitiator may be excited by light to thereby initiate photocuring, and the silane coupling agent may form a covalent bond with materials forming the printing layer 340 and the second adhesive layer 320.

As set forth above, according to one or more exemplary embodiments of the present invention, the decoration film on the upper surface of the window substrate may reduce an incidence path of light leakage.

Accordingly, exemplary embodiments of the present invention may provide a display device with improved light leakage characteristics.

The above-mentioned disclosure is merely directed to embodiments of the present invention, and thus the present invention is not limited thereto. Further, it will be understood by those of ordinary skill in the art that various changes in form and details may be made therein without departing from the spirit and scope of the present invention as defined by the following claims and their equivalents.

What is claimed is:

1. A display device comprising:
a display panel configured to display an image;
a window substrate above the display panel, and comprising:
a display area configured to transmit the image therethrough; and
a non-display area around the display area;
a first adhesive layer between the display panel and the window substrate; and
a decoration film above an upper surface of the window substrate, and comprising:
a base film; and
a printing layer at a first surface of the base film,
wherein at least a portion of the decoration film is above the display area of the window substrate, and
wherein a thickness of the display device between an outermost portion of the display device and a surface of the decoration film is less than a thickness of the window substrate.

2. The display device of claim 1, wherein the window substrate comprises a plastic substrate.

3. The display device of claim 1, further comprising a hard coating layer at a second surface of the base film.

4. The display device of claim 1, further comprising a step-difference compensation layer surrounded by portions of the printing layer at a lower surface of the decoration film.

5. The display device of claim 1, further comprising a second adhesive layer between the window substrate and the decoration film.

6. The display device of claim 5, wherein the printing layer contacts the second adhesive layer.

7. The display device of claim 1, wherein the printing layer corresponds to the non-display area.

8. The display device of claim 7, further comprising an auxiliary adhesive layer at a lower surface of the printing layer.

9. The display device of claim 8, wherein the auxiliary adhesive layer contacts a second adhesive layer between the window substrate and the decoration film.

10. The display device of claim 1, wherein the printing layer comprises:
a first décor printing layer on the first surface of the base film; and
a light blocking printing layer on the first décor printing layer.

11. The display device of claim 10, wherein the light blocking printing layer contacts a second adhesive layer between the window substrate and the decoration film.

12. The display device of claim 10, wherein the first décor printing layer comprises a white printing layer.

13. The display device of claim 10, wherein the light blocking printing layer comprises a black printing layer.

14. The display device of claim 10, wherein the printing layer further comprises a second décor printing layer between the light blocking printing layer and the first décor printing layer.

15. The display device of claim 14, wherein the second décor printing layer comprises a pearl pigment and has a transparent color.

16. A display device comprising:
- a display panel configured to display an image, the display panel comprising:
  - a first substrate;
  - a capping layer on the first substrate; and
  - a thin film encapsulation layer on the capping layer;
- a window substrate above the display panel, and comprising:
  - a display area configured to transmit the image therethrough; and
  - a non-display area around the display area;
- a first adhesive layer between the display panel and the window substrate; and
- a decoration film above an upper surface of the window substrate, and comprising:
  - a base film; and
  - a printing layer at a first surface of the base film.

17. The display device of claim 16, further comprising a polarizer on the thin film encapsulation layer and facing the window substrate.

18. The display device of claim 17, wherein the first adhesive layer is between the polarizer and the window substrate.

19. The display device of claim 17, further comprising a touch screen panel on the polarizer.

20. The display device of claim 16, wherein the display panel comprises an organic light emitting diode (OLED) display panel.

* * * * *